(12) United States Patent
Aiso et al.

(10) Patent No.: US 9,967,981 B2
(45) Date of Patent: May 8, 2018

(54) LIGHT SOURCE UNIT

(71) Applicant: Koito Manufacturing Co., Ltd., Tokyo (JP)

(72) Inventors: Yoshiaki Aiso, Shizuoka (JP); Koji Uchino, Shizuoka (JP); Hiromi Nakamura, Shizuoka (JP); Takayuki Otsubo, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 115 days.

(21) Appl. No.: 15/000,432

(22) Filed: Jan. 19, 2016

(65) Prior Publication Data

US 2016/0219708 A1    Jul. 28, 2016

(30) Foreign Application Priority Data

Jan. 26, 2015   (JP) .................................. 2015-012219

(51) Int. Cl.
*H01L 33/62*    (2010.01)
*H05K 3/10*    (2006.01)
(Continued)

(52) U.S. Cl.
CPC ........... *H05K 3/105* (2013.01); *B60Q 1/2696* (2013.01); *F21S 48/212* (2013.01); *F21S 48/214* (2013.01); *F21S 48/215* (2013.01); *F21S 48/234* (2013.01); *F21S 48/328* (2013.01); *H05K 3/182* (2013.01); *B60Q 1/34* (2013.01); *H05K 1/0206* (2013.01); *H05K 1/0209* (2013.01); *H05K 3/0014* (2013.01); *H05K 2201/0236* (2013.01);
(Continued)

(58) Field of Classification Search
CPC ........ B60C 1/2696; H05K 2201/10106; H05K 1/0206; H05K 1/0209; H05K 1/116; H05K 1/181; H05K 2201/09118; H05K 2203/107; H05K 3/0014; H05K 3/105; H05K 3/182; F21S 48/212; F21S 48/215; F21S 48/328
See application file for complete search history.

(56) References Cited

U.S. PATENT DOCUMENTS 6,299,337 B1 *  10/2001  Bachl .................... F21S 48/215
                                            257/E25.028
7,014,727 B2 *   3/2006  Wargo .................. H05K 3/1258
                                            156/247
(Continued)

FOREIGN PATENT DOCUMENTS

EP        2927727       * 3/2015   ............. F21V 13/04
JP    2013-232305 A    11/2013
JP    2014-213570 A    11/2014

*Primary Examiner* — Peggy Neils
(74) *Attorney, Agent, or Firm* — Ableman, Frayne & Schwab

(57) ABSTRACT

Provided is a light source unit including a base unit formed on a front surface thereof with a first circuit pattern by irradiating laser light to a resin molded article, and a light emitting element mounted on the base unit and electrically connected to the first circuit pattern. The base unit includes a mounting surface portion directed in a prescribed direction such that the light emitting element is mounted thereon, and a sidewall surface portion connected to the mounting surface portion in a plane intersection state, and the sidewall surface portion is formed as an inclined surface intersecting with the mounting surface portion at an obtuse angle.

16 Claims, 11 Drawing Sheets

(51) Int. Cl.
  *B60Q 1/26*  (2006.01)
  *H05K 3/18*  (2006.01)
  *F21S 8/10*  (2006.01)
  *B60Q 1/34*  (2006.01)
  *H05K 1/02*  (2006.01)
  *H05K 3/00*  (2006.01)

(52) U.S. Cl.
  CPC .............. *H05K 2201/09018* (2013.01); *H05K 2201/09118* (2013.01); *H05K 2201/10106* (2013.01); *H05K 2203/107* (2013.01)

(56) References Cited

U.S. PATENT DOCUMENTS

| | | | | |
|---|---|---|---|---|
| 7,312,103 | B1* | 12/2007 | Huemoeller | H01L 21/4857 438/106 |
| 8,186,849 | B2* | 5/2012 | Helbig | F21K 9/00 362/249.02 |
| 8,646,957 | B2* | 2/2014 | Johnson | B60Q 1/0088 362/249.02 |
| 8,657,468 | B2* | 2/2014 | Im | F21S 48/1109 174/254 |
| 9,163,822 | B2* | 10/2015 | Song | F21S 48/1109 |
| 2013/0105832 | A1* | 5/2013 | Peters | F21S 48/1109 257/88 |
| 2014/0218954 | A1* | 8/2014 | Yoon | H01L 33/62 362/546 |
| 2016/0178151 | A1* | 6/2016 | Maitre | B60Q 1/2696 362/545 |

* cited by examiner

FIG.9A
FIG.9B
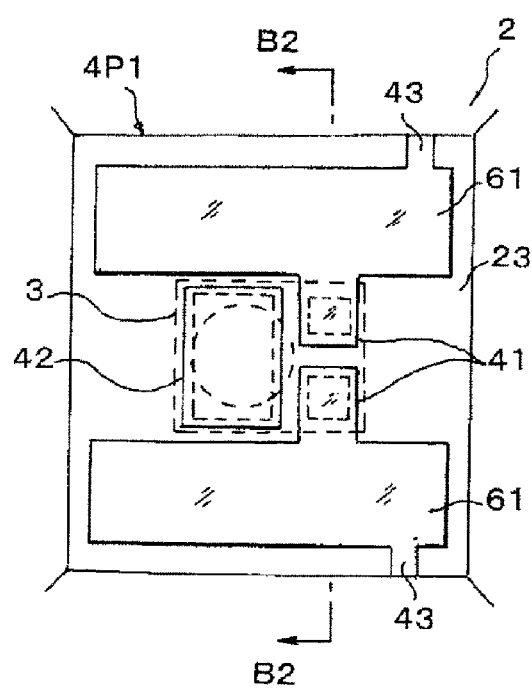
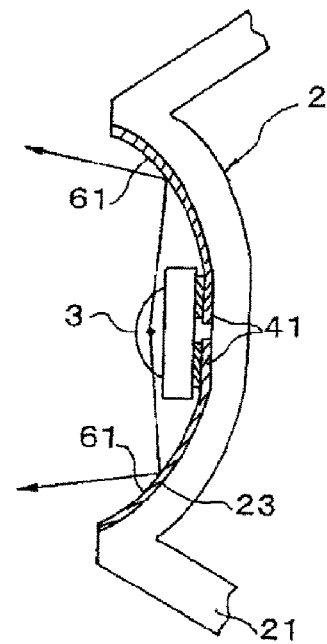

LIGHT SOURCE UNIT

CROSS-REFERENCE TO RELATED APPLICATIONS

This application is based on and claims priority from Japanese Patent Application No. 2015-012219 filed on Jan. 26, 2015, with the Japan Patent Office, the disclosure of which is incorporated herein in its entirety by reference.

TECHNICAL FIELD

The present disclosure relates to a light source unit in which light emitting elements are mounted on a circuit board, and more particularly, to a light source unit which may be configured as a light source of a lamp for a vehicle.

BACKGROUND

Most lamps for a vehicle such as, for example, a car, have adopted a configuration in which a light source unit is equipped within a lamp housing, which is configured with a lamp body and a light transmitting member such as, for example, a lens or a light transmitting cover, and light emitted from the light source unit is directed to the light transmitting member. Recently, in order to respond to the diversification of designs of vehicle lamps, the shapes of the lamp housing and the light transmitting member have become complicated, and thus, a light source unit has been proposed which has a stepped configuration in which light emitting elements are arranged at positions of which the optical axis directions are different from each other.

For example, Japanese Patent Laid-Open Publication No. 2013-232305 proposes a light source unit in which a flexible printed circuit board (FPC), on which a plurality of light emitting elements is mounted, is bent stepwise in a thickness direction and equipped in a lamp housing, and the FPC is fixedly supported on a base member placed within the lamp housing. Therefore, with the light source unit, it is difficult to bend the FPC into a predetermined state to be fixedly supported on the base member. It is also difficult to set a light distribution characteristic of a lamp with high precision by aligning the optical axes of the light emitting elements mounted on the FPC with an optical axis direction of the lamp.

A light source unit using, instead of the FPC, a resin molded article with a circuit pattern formed on a surface thereof by, for example, plating, has been considered in order to improve the light distribution characteristic of the light source unit having the FPC configuration described above. For example, Japanese Patent Laid-Open Publication No. 2014-213570 proposes such a resin molded article that is formed by performing injection-molding using a special resin that is obtained by hybridizing a metal complex and a base resin, irradiating laser light to a portion of the obtained resign molded article to enhance the catalyst activity of the metal complex, and forming an electroless plating film only on the portion irradiated with the laser light. Such a resin molded article obtained by combining a circuit pattern and a resin structure is also referred to as a molded interconnect device (MID).

SUMMARY

When the resin molded article of Japanese Patent Laid-Open Publication No. 2014-213570 is to be applied to the stepped light source unit of Japanese Patent Laid-Open Publication No. 2013-232305, mounting surface portions of the resin molded article, on which the light emitting elements are mounted, are oriented almost perpendicular to step-like sidewall surface portions present between the neighboring mounting surface portions. Therefore, when the circuit pattern is formed across the mounting surface portions and the sidewall surface portions of the resin molded article, it is necessary to irradiate laser light while changing the inclined state of the resin molded article such that the laser light is directed almost perpendicular to the mounting surface portions and the sidewall surface portions. Alternatively, in a case where the resin molded article is fixedly supported, it is necessary to irradiate laser light to the mounting surface portions and the sidewall surface portions while changing the irradiation direction of the laser light. Therefore, the process of forming a wiring circuit on the resin molded article becomes complicated, and a circuit pattern with high precision is difficult to form.

An object of the present disclosure is to provide a light source unit in which a circuit pattern of a resin molded article may be easily formed.

A light source unit of the present disclosure includes: a base unit including, on a front surface thereof, a first circuit pattern that is formed by irradiating laser light to a resin molded article; and a light emitting element mounted on the base unit and electrically connected to the first circuit pattern. The base unit includes: a mounting surface portion oriented in a predetermined direction, the light emitting element being mounted on the mounting surface portion, and a sidewall surface portion connected to the mounting surface portion in a plane intersection state. The sidewall surface portion is formed as an inclined surface that intersects with the mounting surface portion at an obtuse angle.

In the present disclosure, the mounting surface portion may include a mounting land to surface mounting the light emitting element thereon, and a laser irradiation hole formed through the base unit in a thickness direction may be opened on the mounting surface portion to enable irradiation of laser light from a rear side. In addition, the mounting surface portion may include a reflow stop in a lower region of the mounting land to suppress a reflow material from flowing down when mounting the light emitting element. Further, the mounting surface portion may include a reflector layer formed as a portion of the first circuit pattern to reflect light emitted from the light emitting element.

In addition, the light source unit of the present disclosure may further include a second circuit pattern formed on a rear surface of the base unit and electrically connected to the first circuit pattern. Then, the base unit may include a heat sink layer formed on the rear surface thereof as a portion of the second circuit pattern. Alternatively, an electronic element electrically connected to the second circuit pattern may be mounted on the rear surface of the base unit.

With the present disclosure, since the inclination angle of the sidewall surface portion, which is in the place intersection state with the mounting surface portion, is an obtuse angle, laser light may be irradiated from a direction fixed in relation to the base unit when the base unit is manufactured by the MID technology. Accordingly, when forming the first circuit pattern on the front surface of the base unit, it becomes unnecessary to change the irradiation direction of the laser light that is irradiated to the base unit or to change the orientation of the base unit in relation to the irradiation direction of the laser light. Thus, the first circuit pattern may be easily manufactured.

With the present disclosure, even when forming the second circuit pattern on the rear surface of the base unit, it becomes unnecessary to change the irradiation direction of the laser light that is irradiated to the base unit or to change the orientation of the base unit in relation to the irradiation direction of the laser light. Thus, the second circuit pattern may be easily manufactured.

The above-described summary is illustration purposes only and does not intend to limit in any ways. In addition to the illustrative embodiment, examples, and features described above, additional embodiment, example, and features will become apparent by referring to the drawings and the following detailed description.

BRIEF DESCRIPTION OF THE DRAWINGS

FIG. 9A is a front view illustrating a mounting surface portion of the base unit according to a first modification, and FIG. 9B is a sectional view taken along line B2-B2 in FIG. 9A.

DETAILED DESCRIPTION

In the following detailed description, reference is made to the accompanying drawing, which form a part hereof. The illustrative exemplary embodiments described in the detailed description, drawings, and claims are not meant to be limiting. Other exemplary embodiments may be utilized, and other changes may be made, without departing from the spirit or scope of the subject matter presented here.

Figure 1A:
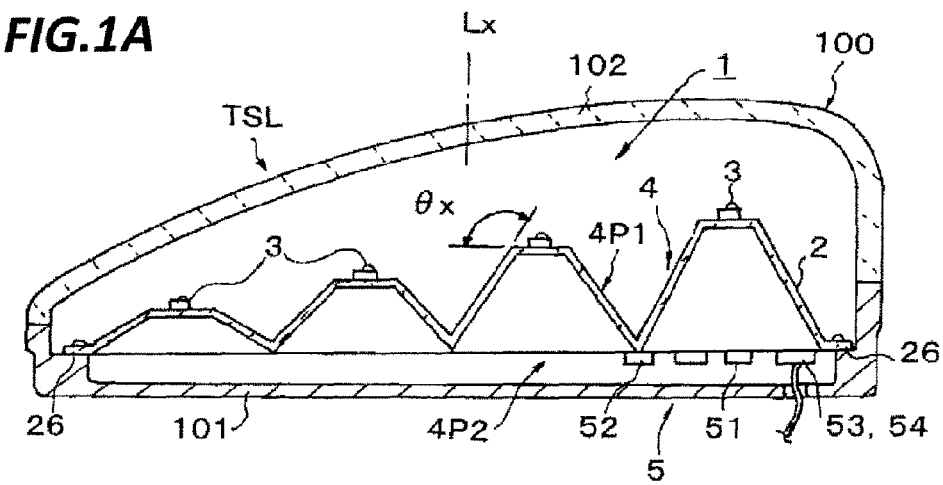
FIG. 1A is a schematic sectional view illustrating a turn signal lamp (TSL) according to the present disclosure.

Next, exemplary embodiments of the present disclosure will be described with reference to the accompanying drawings. FIG. 1A is a schematic sectional view illustrating an exemplary embodiment in which a light source unit of the present disclosure is applied to a turn signal lamp (TSL) that is used as a marker lamp of a vehicle. A lamp housing 100 is constituted with a lamp body 101 and a light transmitting cover 102, and a light source unit 1 is equipped within the lamp housing 100. The light source unit 1 includes a base unit 2 having an MID structure in which a wiring circuit is integrally formed on a resin molded article, and a plurality of semiconductor light emitting elements mounted on the base unit 2 (herein, chip-like LEDs 3).

The light transmitting cover 102 of the TSL is formed of an umber light transmitting resin, and is formed as a plate member having a curved surface following the curved surface shape of a vehicle body on which the TSL is mounted. In addition, the following configuration is adopted: while the plurality of LEDs 3 of the light source unit 1 are arranged in a direction perpendicular to an optical axis Lx, the LEDs 3 are arranged stepwise to have different optical axial positions, respectively, along the lamp optical axis Lx to correspond to the curved surface shape of the light transmitting cover 102. Here, the lamp optical axis Lx corresponds to the light irradiation direction of the TSL.

Figure 1B:
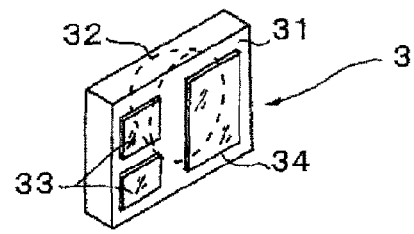
FIG. 1B is a perspective view illustrating an external appearance of an LED.

As illustrated in a rear perspective view of FIG. 1B, each LED 3 is configured as follows: the front surface of a rectangular chip body 31 is configured as a light emitting surface 32, and a pair of positive and negative electrodes 33 and a heat sink electrode 34 are formed on the rear surface of the rectangular chip body 31. The light emitting surface 32 is formed in a dome shape as indicated by a dotted line. The positive and negative electrodes 33 cause the light emitting surface 32 to emit light when a required current is fed therebetween. The heat sink electrode 34 radiates heat generated during the light emission, and is in an electrically floating state, but is referred to as a heat sink electrode herein.

The base unit 2 is configured as an MID structure, and circuit patterns 4 are formed on a front surface of the base unit 2, i.e. a surface at the side directed to the front side of the TSL and a rear surface of the base unit 2, i.e. a surface at the side directed to the rear side of the TSL, respectively. Here, the circuit pattern 4 formed on the front surface of the base unit 2 is referred to as a first circuit pattern 4P1, and the circuit pattern formed on the rear surface is referred to as a second circuit pattern 4P2.

Figure 1C:
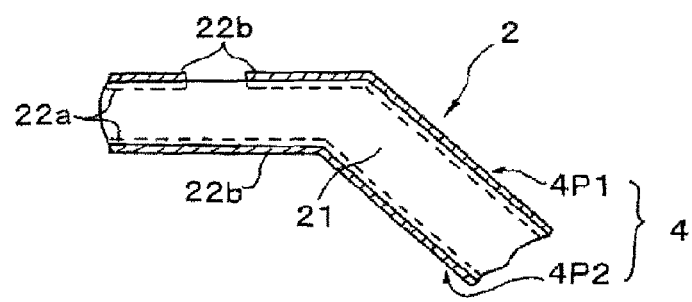
FIG. 1C is an enlarged sectional view illustrating a portion of a base unit.

The first and second circuit patterns 4P1 and 4P2 are formed by the same technology as the MID structure described in Japanese Patent Laid-Open Publication No. 2014-213570. As illustrated in the partial enlarged sectional view of FIG. 1C, laser light is irradiated in a desired pattern to each of the front surface and the rear surface of a resin molded article 21 (here, referred to as a "base body 21"), which is formed by injection-molding a resin obtained by hybridizing a metal complex and a base resin, thereby enhancing the catalyst activity of the metal complex, and an electroless plating film 22a represented by dotted lines is formed only on a laser-irradiated portion. In addition, here, an electroplating film 22b, which is formed of a conductive layer having high conductivity, is formed, and the first and second circuit patterns 4P1 and 4P2 are formed, by performing electroplating using the electroless plating film 22a. In this exemplary embodiment, nylon MDX6 is used as a material of the base body 21. This material has high insulation, and thus the formed circuit patterns 4P1 and 4P2 remain insulated from each other.

Figure 2:
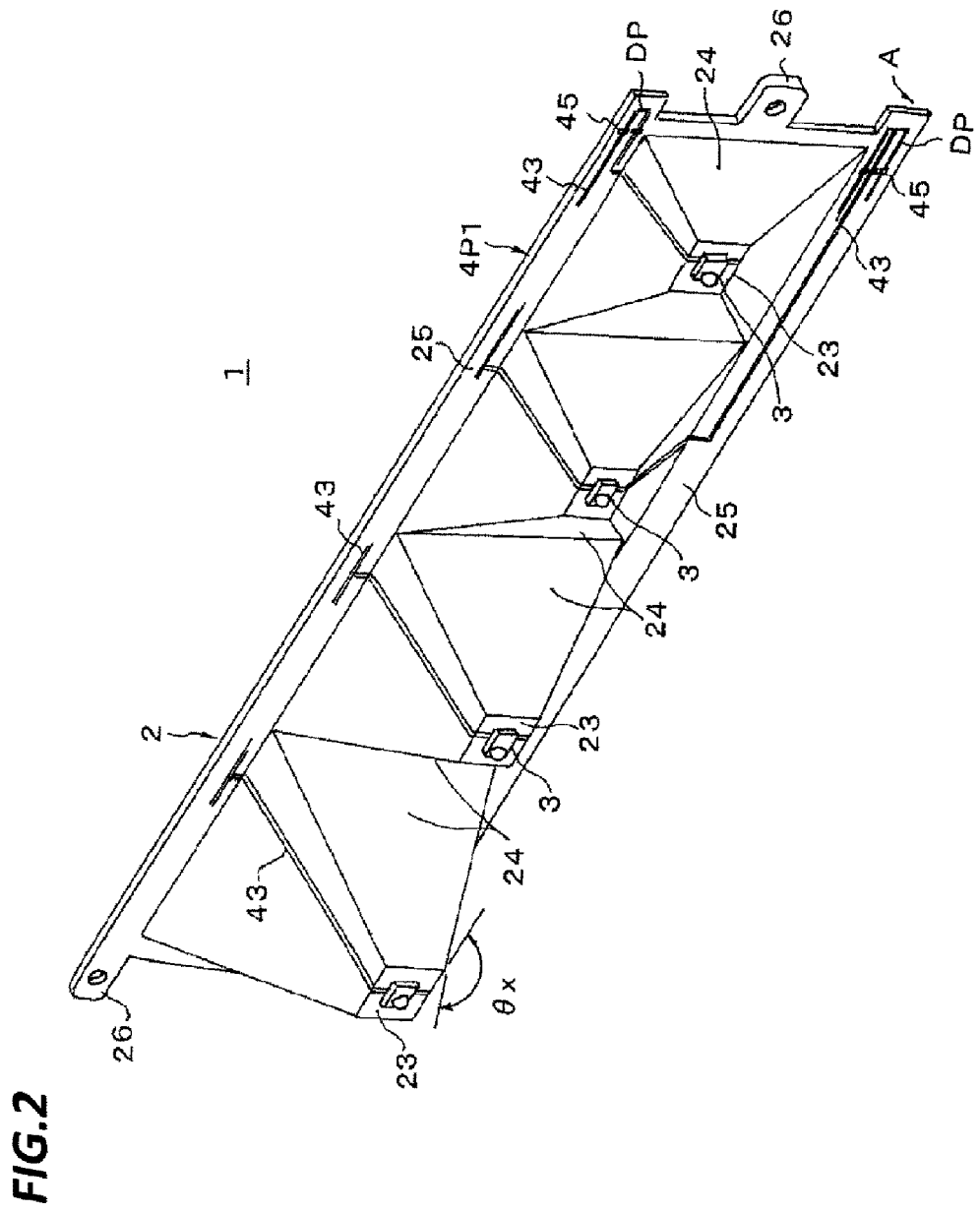
FIG. 2 is a schematic front perspective view illustrating the base unit.
Figure 3:
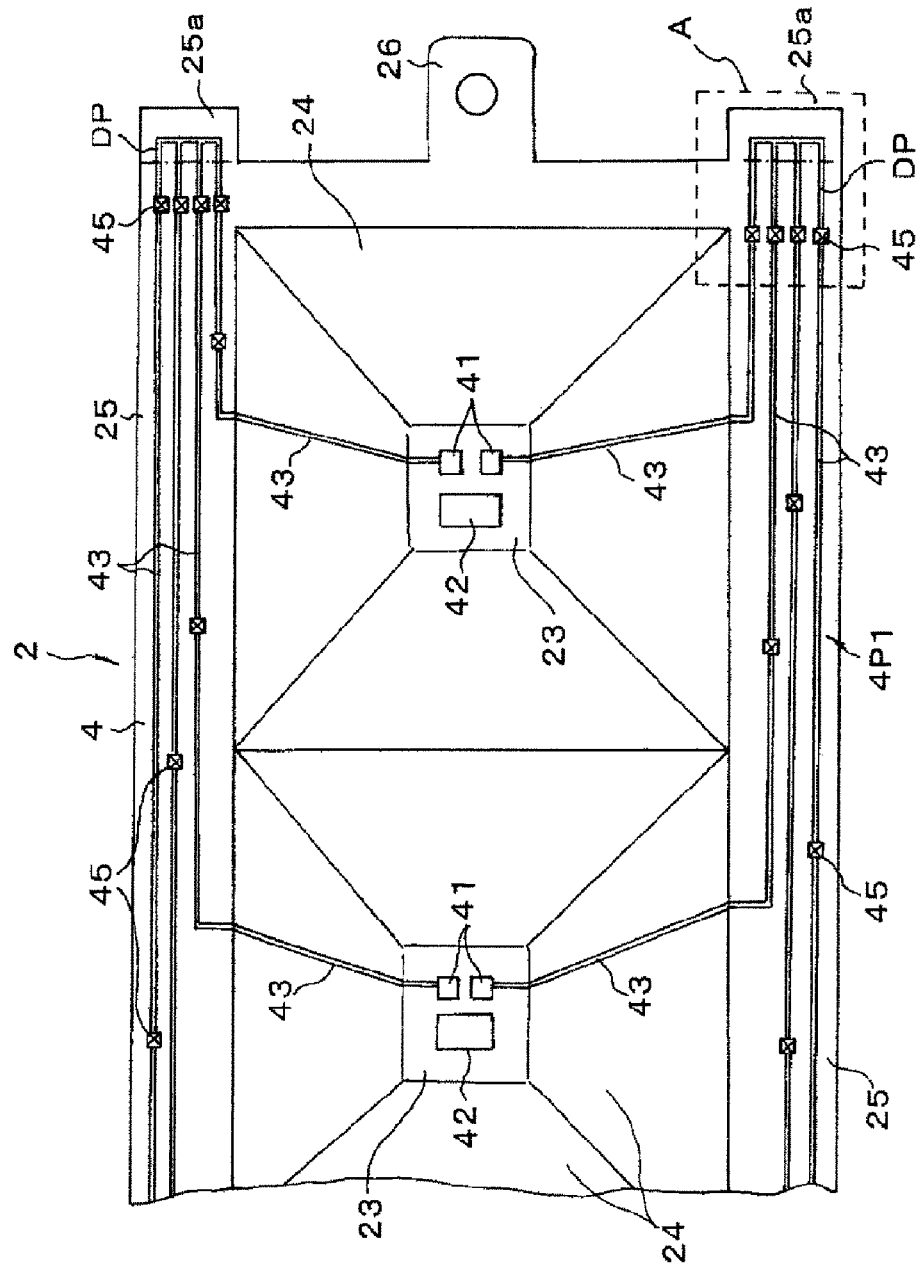
FIG. 3 is a front view illustrating a portion of the base unit.

FIG. 2 is a schematic perspective view illustrating the base unit 2 viewed from the front side, and FIG. 3 is a front view illustrating a portion of the base unit. The base unit 2 includes a plurality of mounting surface portions 23, each of which is oriented in the direction of the lamp optical axis Lx of the TSL and forms an approximately rectangular plane on which an LED 3 is mounted. The mounting surface portions 23 are arranged in a direction orthogonal to the lamp optical axis Lx, and arranged stepwise such that the positions of the respective mounting surface portions 23 in the direction of the lamp optical axis Lx are different from each other.

In addition, the base unit 2 includes sidewall surface portions 24 to connect the plurality of mounting surface portions 23 to one another, and the plurality of mounting surface portions 23 are configured as the integrated base unit 2 by the sidewall surface portions 24. The sidewall surface portions 24 are formed in a pyramidal (quadrangular pyramidal) shape with the top surface being formed by each mounting surface portion 23. That is, the sidewall surface portions 24 are formed as inclined surface portions to vertically and horizontally expand from upper and lower sides and left and right sides of the mounting surface portion 23, respectively. In addition, as will be described below, an intersection angle θx of each sidewall surface portion 24 in relation to a corresponding mounting surface portion 23 is designed to be an obtuse angle, i.e. an angle greater than a right angle. Here, the sidewall surface portions 24 are configured as inclined surface portions which intersect with the mounting surface portions 23 at 120 degrees.

In addition, the base unit 2 has flange-like circuit surface portions 25 that extend from the upper and lower sides of the sidewall surface portions 24 by a required size upward and downward, respectively, to be oriented in parallel with the mounting surface portions 23, when viewed from the front side. The circuit surface portions 25 will be described below. Then, a bracket piece 26 having a required shape is integrally formed on each of the left and right sides of the base unit 2. When the bracket pieces 26 are fixed to the lamp body 101 by, for example, screws, the base unit 2 is fixedly supported within the lamp housing 100.

Figure 4:
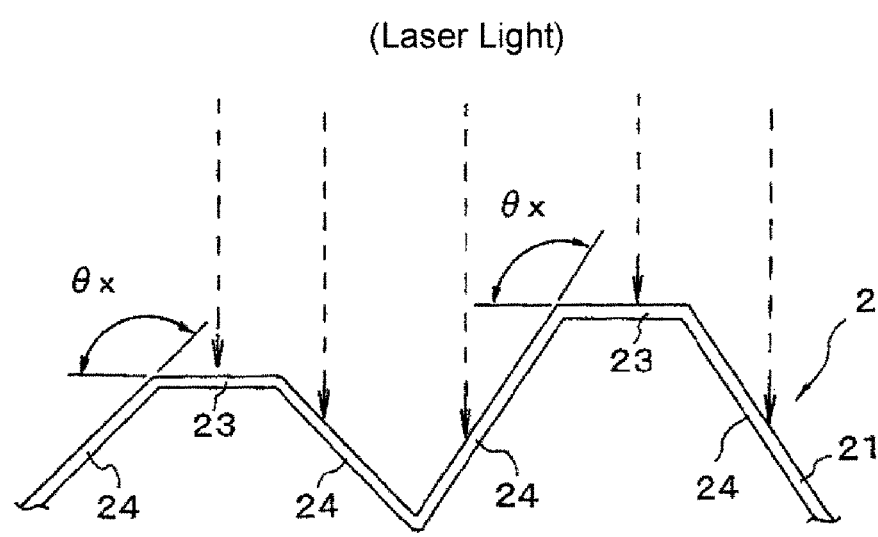
FIG. 4 is a conceptual view illustrating a state in which laser light is irradiated to a base body.

As illustrated in the conceptual view of FIG. 4, when the mounting surface portions 23, which face the front side of the base body 21, are oriented in a direction perpendicular to the irradiation direction of laser light while laser light is irradiated to form the first circuit pattern 4P1 on the front surface of the base portion 2 in the MID technology, the sidewall surface portions 24 present between the respective mounting surface portions 23 are oriented at a smaller angle than a right angle in relation to the irradiation direction of laser light since the side wall surface portions 24 intersect with the mounting surface portions 23 at an obtuse angle θx as described above. According to the examination performed by the inventors, the angle θx may be set to be greater than 120 degrees, and the irradiation angle of laser light to the base unit 2 may be set to be less than 60 degrees.

Accordingly, even if the orientation of the base body 21 remains constant in relation to the irradiated laser light, irradiation of the laser light in a required pattern is enabled in relation to the mounting surface portions 23 and the sidewall surface portions 24, and further, in relation to the circuit surface portions 25, although not illustrated in FIG. 4. Therefore, it becomes unnecessary to change the irradiation direction of laser light or to change the orientation of the base body 21 in relation to the irradiation direction of laser light when irradiating the laser light to the base body 21, and thus the first circuit pattern 4P1 of the base unit 2 may be easily manufactured.

The foregoing descriptions may also applicable even when the second circuit pattern 4P2 is formed on the rear surface of the base body 21. Although not illustrated, when the rear surface of each mounting surface portion 23 is oriented in a direction perpendicular to the laser irradiation direction, irradiation of the laser light in relation to the rear surfaces of the mounting surface portions 23 and the rear surfaces of the circuit surface portions 25 and the sidewall surface portions 24 is enabled, and thus the second circuit pattern 4P2 of the base unit 2 may be easily formed.

Figure 5A:
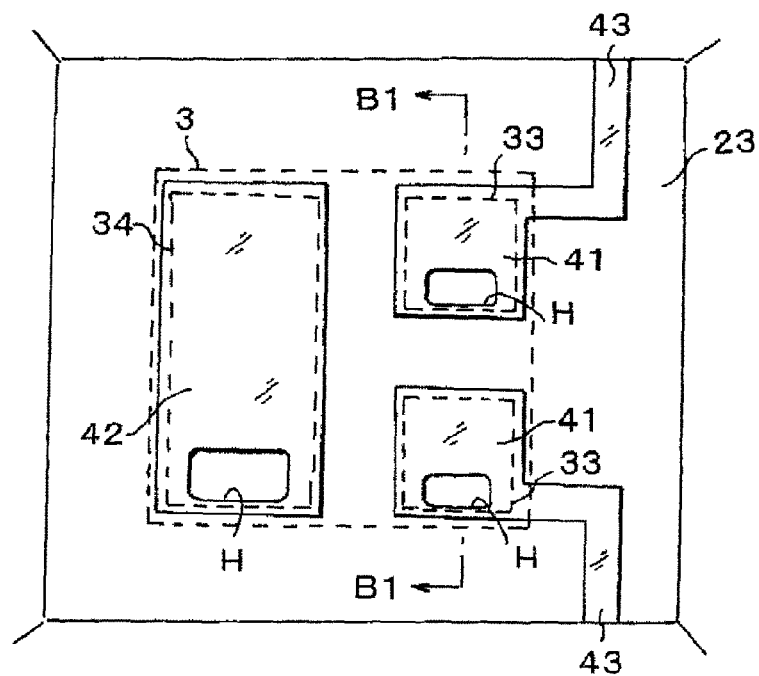
FIG. 5A is an enlarged front view illustrating a mounting surface portion.
Figure 5B:
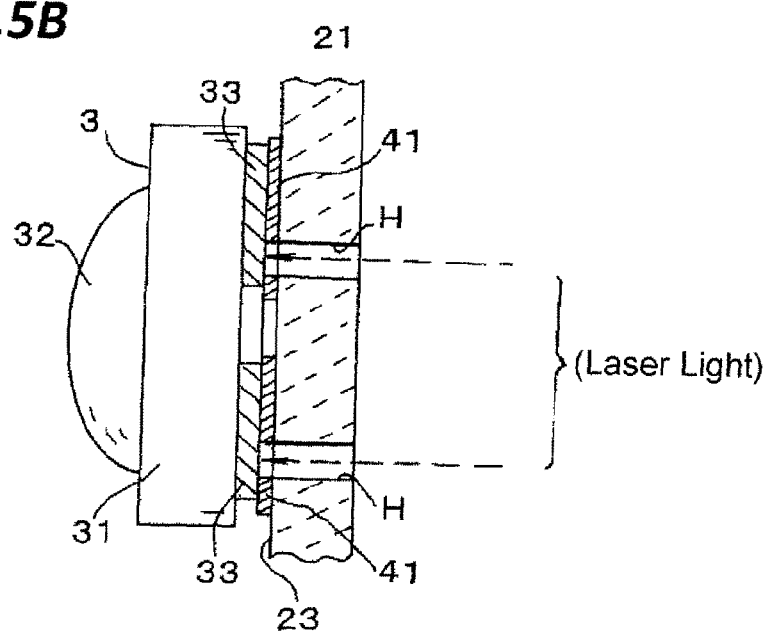
FIG. 5B is a sectional view taken along line B1-B1.

FIG. 5A is an enlarged view of the mounting surface portion 23 illustrated in FIG. 3 and FIG. 5B is a sectional view taken along line B1-B1 in FIG. 5A. The mounting surface portion 23 includes mounting lands 41 formed by vertically arranging a pair of rectangular conductive layers at a required distance, and a heat sink land 42 arranged adjacent to the mounting lands 41. The mounting lands 41 and the heat sink land 42 are configured as a portion of the first circuit pattern 4P1.

In addition, in FIG. 3, connection patterns 43 formed of conductive layers extending from the mounting lands 41 are formed on the front surfaces of the sidewall surface portions 24 in a required pattern. The connection patterns 43 are also formed as a portion of the first circuit pattern 4P1. The connection patterns 43 are formed across the regions of the circuit surface portions 25 arranged in the upper and lower portions of the base unit 2.

In each mounting surface portion 23, the positive and negative electrodes 33, which are arranged on the rear surface of the LED 3, are surface mounted on the mounting lands 41, respectively. The heat sink electrode 34 formed on the rear surface of the LED 3 is surface mounted on the heat sink land 42. A laser reflow method is adopted for the surface mounting of the LED 3 with respect to the mounting lands 41 and the heat sink land 42. In order to implement the laser reflow, as illustrated in FIGS. 5A and 5B, a laser irradiation hole H, which extends through the base unit 2 in the thickness direction, is opened in a portion of each of the mounting lands 41 and the heat sink land 42.

By forming the laser irradiation holes H, when surface mounting the LED, as illustrated in FIG. 5B, laser light is irradiated from the rear side of the base unit 2 (base body 21), and the laser light is directly irradiated to the positive and negative electrodes 33 of the LED 3 through the laser irradiation holes H. As a result, the surface mounting by the laser reflow method is enabled by heating the positive and negative electrodes 33 of the LED 3 by laser light energy, and melting a reflow material such as, for example, solder, by the heat. The above descriptions are equally applicable to the reflow in the heat sink electrode 34 and the heat sink land 42. The reflow is performed by heating the heat sink electrode 34 by the irradiation of laser light through the laser irradiation hole H formed in the heat sink land 42.

Figure 6A:
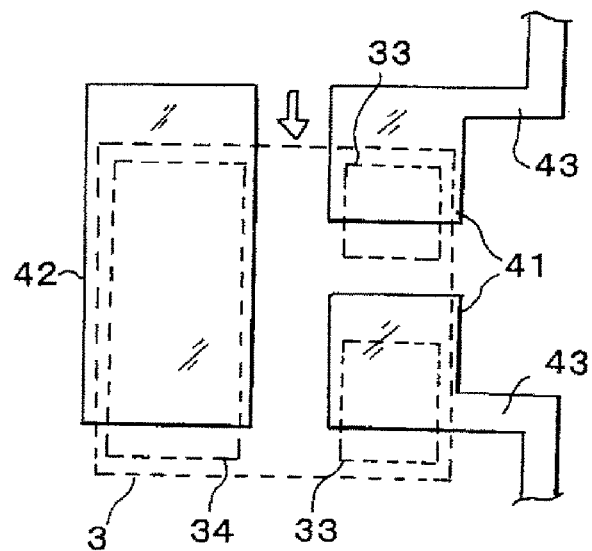
FIG. 6A is a conceptual view illustrating the flow-down of a reflow material.

In a case where it is unavoidable to melt the reflow material in a state where the mounting surface portion 23 is placed nearly vertical during the reflow, as illustrated in the conceptual view of FIG. 6A, when the reflow material is molten during the reflow, the reflow material flows down to the surfaces of the mounting lands 41 or the surface of the heat sink land 42, and the LED 3 may also move downward integrally with the reflow material. In such a state, it is difficult to appropriately mount the positive and negative electrodes 33 or the heat sink electrode 34 on the mounting lands 41 or the heat sink land 42.

In the present exemplary embodiment, the laser irradiation holes H are opened in the mounting lands 41 and the heat sink land 42. Moreover, the laser irradiation holes H are opened at the positions near the lower ends of the respective lands 41 and 42. Therefore, even if the reflow material is molten in the respective lands 41 and 42 during the reflow, the flow-down of the reflow material is suppressed by the laser irradiation holes H. As a result, the LED to be mounted are prevented from moving downward integrally with reflow material along the surface of the mounting land 41 or the heat sink land 42, and the LED 3 may be accurately mounted on the surface of the mounting surface portion 23 at a prescribed position. That is, the laser irradiation holes H are configured as thermal lands (reflow stops in the present disclosure).

It will be sufficient if the reflow material, which flows on the mounting lands 41 or the heat sink land 42, is prevented from flowing down to the lower regions of the lands 41 and 42, the thermal lands, i.e. the reflow stops may be configured by removing a conductive layer from the lower regions of the lands 41 and 42. For example, in the example of FIG. 6B, each connection pattern 43 connected to a mounting land 41 has a pattern shape connected to an upper region of the mounting land 41 so that the reflow material, which flows downward on the surface of the mounting land 41, may be prevented from flowing down to the lower region along the connection pattern 43. In addition, a notch 42*a* is formed in a central portion of a lower edge of the heat sink land 42, thereby preventing the reflow material from flowing down from the lower edge.

The connection patterns 43, which are formed across the sidewall surface portions 24 and the circuit surface portions 25, are electrically connected to the second circuit patterns 4P2 on the rear side of the base unit 2 via the through-holes 45 formed in the circuit surface portions 25 to penetrate the base unit 2 in the thickness direction as illustrated in FIG. 3. The through-holes 45 may be configured by forming the electroless plating layer 22*a* to penetrate the base body 21 in the thickness direction. The through-holes 45 formed of the electroless plating layer 22*a* may be configured to fill the through-holes formed in the base body 21, or may be configured as a layer formed on the inner circumferential surfaces of the through-holes.

Here, as described above, the first circuit pattern 4P1 is formed of the electroplating layer 22*a* by the electroplating method using the electroless plating layer 22*a*. In the electroplating method, there is a technology using a dummy pattern which may be used when forming a plurality of circuit patterns 4P1 insulated from one another by the electroplating method. This technology is a technology that electrically connects a plurality of circuit patterns to each other by a dummy pattern, and simultaneously apply a current to all of the circuit patterns using the dummy pattern so as to form a conductive layer by electroplating, and after the electroplating, cuts or removes the dummy pattern so as to insulate the respective circuit patterns from one another.

In this technology, the dummy pattern is formed at a location where the neighboring circuit patterns are close to each other. Thus, in a case where a plurality of dummy patterns are required, the dummy patterns are formed in a scattered state, and consequently, it is unavoidable that the removal work of the dummy patterns becomes complicated after the electroplating.

Figure 7A:
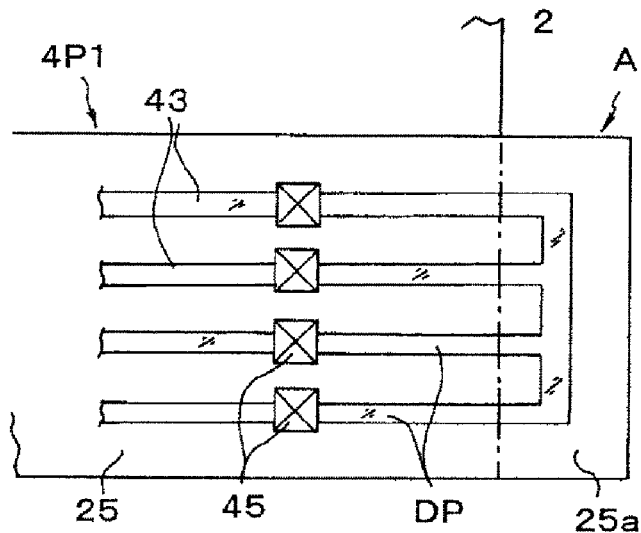
FIGS. 7A and 7B are front views of a portion of the base unit, illustrating an electroplating method using dummy patterns.
Figure 7B:
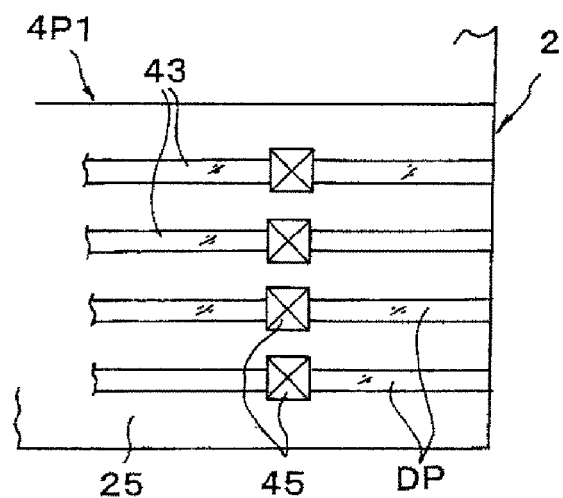

Here, as illustrated in FIG. 7A that illustrates the portion A of FIG. 3 in an enlarged scale, all of the connection patterns 43 formed on the circuit surface portion 25 are connected by dummy patterns DP in a portion of the base unit 2, i.e. the portion A. That is, the dummy patterns DP extend respectively from the through-holes 45, which connect the connection patterns 43 to the second circuit pattern 4P2 on the rear surface of the base unit 2, to the portion A, and the respective dummy patterns DP are electrically connected to one another at the extended ends thereof (hereinafter referred to as "extension ends"). The dummy patterns DP are formed as a portion of the electroless plating layer 22*a* of the first circuit pattern 4P1.

Figure 6B:
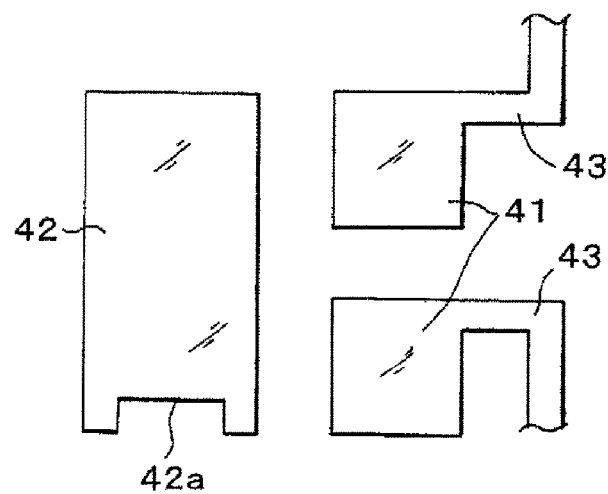
FIG. 6B is a front view illustrating a modification of lands.

Accordingly, all of the connection patterns 43 are electrically connected to each other at the extension ends of the dummy patterns DP. Thus, when a current is applied to any one connection pattern 43 upon electroplating, the current is simultaneously applied to the other connection patterns 43, and the electroplating layer 22*b* is formed on all of the connection patterns 43. In addition, after the electroplating, as illustrated in FIG. 6B, a portion 25*a* of the circuit surface portion 25, at which the extension ends of the dummy patterns DP are present, is cut or removed at a location represented by a chain lines, thereby insulating the respective connection patterns 43 from each other. In this way, since the removal work of the dummy patterns DP may be performed at only one location of the base unit 2 the removal work can be simply performed. Although a detailed description thereof is omitted, the foregoing descriptions are also applicable to the second circuit pattern 4P2 formed on the rear surface of the base unit 2.

Figure 8:
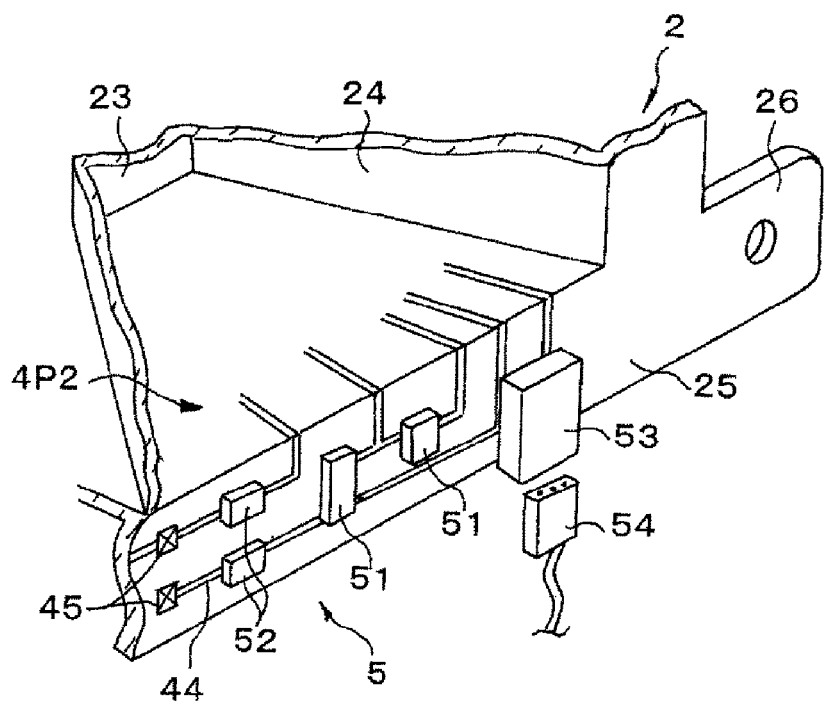
FIG. 8 is a schematic perspective view illustrating a power feed pattern and a light emitting circuit.

A portion of the second circuit pattern 4P2 formed on the rear surface of the base unit 2 is configured as a power feed pattern 44 that is electrically connected to the connection patterns 43 of the first circuit pattern 4P1 by the through-holes 45. FIG. 8 is a perspective view illustrating a portion of the base unit 2 when viewed from the rear side, and the power feed pattern 44, which is configured as a portion of the second circuit pattern 4P2, is mainly formed on the rear surface of the circuit surface portion 25 of the base unit 2. In addition, a portion of the power feed pattern 44 extends to a region on the rear surface of the sidewall surface portion 24.

In addition, lands (not illustrated), on which electronic elements 5, including semiconductor active elements 51, passive elements 52 such as, for example, chip resistors or chip condensers, and other elements, may be mounted, are integrally formed on the rear surface of the circuit surface portion 25 via the power feed pattern 44. The electronic elements 5 are mounted on each of the lands and a light emitting circuit to emit light from the LED 3 is constituted with the electronic elements 5.

In addition, as one of the electronic elements, a power connector 53 is mounted on the power feed pattern 44. An external connector 54 connected to an external power source is fitted to the power connector 53, and external power may be supplied to the power feed pattern 44 via the power connector 53.

A light emitting circuit is constituted with the power supply pattern 44 that is formed of the second circuit pattern 4P2 of the base unit 2, and the electronic elements 5. In addition, upon being connected to the external power source, the light emission power generated by the light emitting circuit is fed from the power supply pattern 44 to the connection patterns 43 on the front side of the base unit 2, and is further fed to the mounting lands 41 of the mounting surface portions 23. As a result, the plurality of LEDs 3 are wholly or selectively subjected to a light emission control by the light emission circuit at a required luminous intensity, and the timing of light emission by the light emitting circuit.

As described above, the light source unit of the exemplary embodiment may irradiate laser light from a given direction to the front surface or the rear surface of the base body 21 when the base unit 2 is manufactured by the MID technology since an intersection angle of the sidewall surface portion 24 that is in plane intersection with the mounting surface portion 23, in other words, the inclination angle of the sidewall surface portion 24 is an obtuse angle that is greater than a right angle. Thus, when the first circuit pattern 4P1 is formed on the front surface of the base body 21, or when the second circuit pattern 4P2 is formed on the rear surface of the base body 21, it is unnecessary to change the irradiation direction of laser light that is irradiated to the base body 21, or to change the orientation of the base body 21 in relation to the irradiation direction of the laser light is no longer necessary. Thus, the circuit pattern may be easily manufactured.

In the light source unit of the present disclosure, the base unit may be configured as follows. FIG. 9A is a front view illustrating the mounting surface portion 23 of the base unit 2 according to a first modification, and FIG. 9B is a sectional view taken along line B2-B2 in FIG. 9B. Here, the mounting surface portion 23 of the base unit 2 is formed as a required concavely curved surface, for example, a portion of a rotational parabolic surface, and a portion of the first circuit pattern 4P1 formed on the front surface of the mounting surface portion 23 is configured as a reflector layer 61.

In this example, a pair of reflector layers 61 are formed in a state of being spaced apart from each other at the upper and lower sides of a pair of mounting lands 41 by enlarging the longitudinal and transverse dimensions of a portion of each of the connection patterns 43 connected to the respective mounting lands 41. Since the reflector layers 61 are integrally formed with the mounting lands 41, the electroplating in the MID technology is enabled. In addition, in this case, the first circuit pattern 4P1, which forms the mounting lands 41 and the reflector layers 61, may be formed of a material having high conductivity and high reflectivity.

The reflector layers 61 may be formed separately from the mounting lands 41. Upon being formed separately from each other, the reflector layers 61 are electrically insulated from the mounting lands 41. Therefore, the reflector layers 61 may be formed simultaneously with the mounting lands 41 by electroplating using the dummy pattern DP as described above.

By providing the reflector layers 61 formed by the first circuit pattern 4P1, the light emitted from the LED 3 is reflected forward by the reflector layers 61 so that a required light distribution may be obtained. In addition, in this configuration, since a reflector, which is a separate member from the base unit 2, becomes unnecessary, the number of constituent elements of the TSL may be reduced, and the simplified configuration and the low price of the TSL may be realized.

Figure 10:
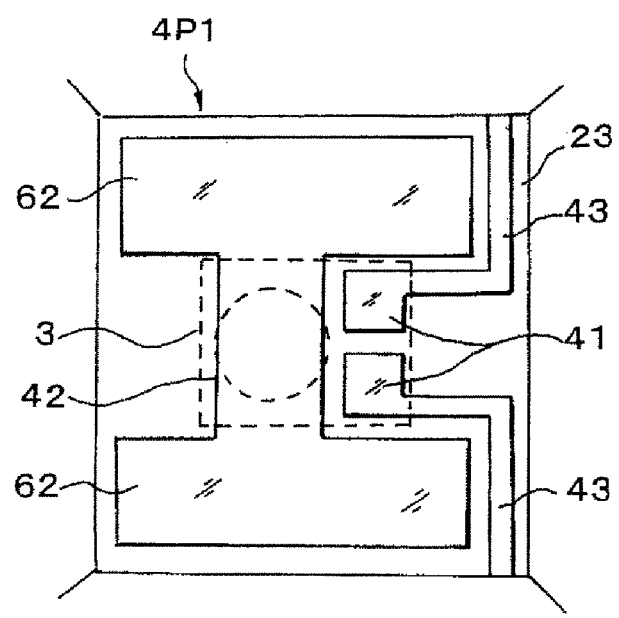
FIG. 10 is a front view illustrating a mounting surface portion of another example of the first modification.

In addition, when reflector layers are formed to be electrically insulated from the mounting lands 41, the reflector layers 62 may be integrally formed with the heat sink land 42 as illustrated in FIG. 10. As such, since light reflection of the LED 3 by the reflector layers 62 may be realized and the area of the heat sink land 42 is enlarged by the reflector layers 62, the reflector layers 62 may also serve as a heat sink, and the heat radiation effect of the LED 3 by the heat sink land 42 is increased.

Figure 11A:
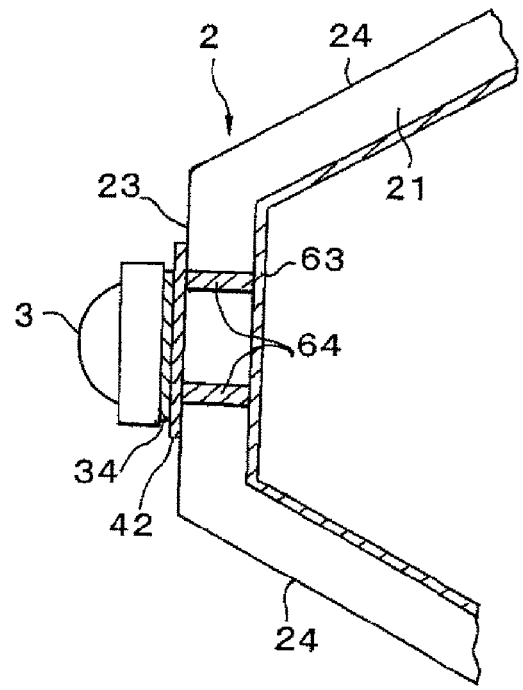
FIGS. 11A and 11B are sectional views illustrating a mounting surface portion of the base unit according to a modification.

As a second modification of the base unit 2, a heat sink layer 63, which is electrically insulated from the power feed pattern 44, may be formed on the rear surface of a region including the mounting surface portion 23 and the sidewall surface portion 24 of the base unit 2 using a portion of the second circuit pattern 4P2, as illustrated in the cross sectional view of an area including the mounting surface portion 23 in FIG. 11A. The heat sink layer 63 causes the base body 21 to communicate with the heat sink land 34 formed on the front surface of the base unit 2 by one or more heat transfer through-holes 64 perforated in the base body 21 in the thickness direction.

By forming the heat sink layer 63, heat generated from the LED 3 is transferred from the heat sink electrode 34 to the heat sink land 42, and further transferred to the heat sink layer 63 through the heat transfer through-holes 64 so that heat can be efficiently radiated from the heat sink layer 63.

The heat sink layer 63 has no thermal effect on the LED 3 present on the front surface of the base unit 2 during the heat radiation since the heat sink layer 63 is present on the rear surface of the base unit 2.

Figure 11B:
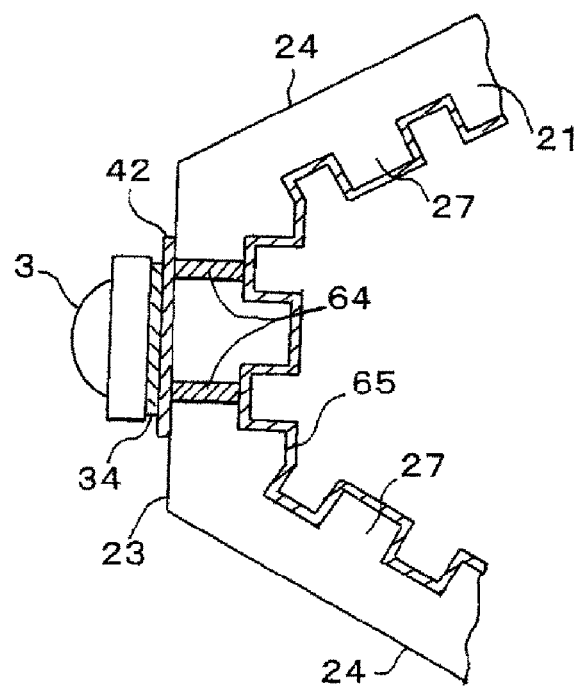

Here, as illustrated in the same cross-sectional view in FIG. 11B, fine irregularities 27 may be formed on the rear surface of a required area including the mounting surface portion 23 and the sidewall surface portions 24 of the base body 21, and a heat sink layer 65 may be formed on the surfaces of the irregularities 27. The surface area of the heat sink layer 65 is enlarged due to the surface shape of the fine irregularities 27, and thus the heat sink layer 65 may achieve higher heat radiation effects compared to the heat sink layer 63 having a flat plane structure illustrated in FIG. 11A.

The present disclosure may be applied to a base unit according to the light source unit of the present disclosure so long as it includes a mounting surface portion on which one or more LEDs are mounted, and a sidewall surface portion connected to the mounting surface portion in a plane intersection state so that a portion of the base unit is formed in a stepped form and a mesa shape. In particular, the present disclosure may be equally applied to a light source module so long as it includes a base unit manufactured by the MID technology using laser light.

Although the above-described exemplary embodiments illustrate an example in which the light source of the present disclosure is applied to a light source module of a TSL of a vehicle, the light source unit may be applied as a light source unit of other lamps.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A light source unit comprising:
   a base unit including, on a front surface thereof, a first circuit pattern that is formed by irradiating laser light to a resin molded article; and
   a light emitting element mounted on the base unit and electrically connected to the first circuit pattern,
   wherein the base unit includes:
   a mounting surface portion oriented in a predetermined direction, the light emitting element being mounted on the mounting surface portion,
   a plurality of sidewall surface portions positioned below the mounting surface portion to be supported and connected to the mounting surface portion through a plurality of sides that forms the mounting surface portion in a plane intersection state, respectively, and
   the plurality of sidewall surface portions are slanted away from the mounting surface portion from the plurality of sides of the mounting surface portion, respectively, thereby forming an inclined surface that intersects with the mounting surface portion at an obtuse angle, respectively.

2. The light source unit of claim 1, wherein the mounting surface portion includes a mounting land configured to surface mount the light emitting element thereon, and a laser irradiation hole formed through the base unit in a thickness direction is opened on the mounting surface portion to enable irradiation of laser light from a rear side.

3. The light source unit of claim 2, wherein the irradiation hole is configured to serve as a reflow stop in a lower region of the mounting land to suppress a reflow material from flowing down when mounting the light emitting element.

4. The light source unit of claim 1, wherein the mounting surface portion includes a reflector layer formed as a portion of the first circuit pattern to reflect light emitted from the light emitting element.

5. The light source unit of claim 2, wherein the mounting surface portion includes a reflector layer formed as a portion of the first circuit pattern to reflect light emitted from the light emitting element.

6. The light source unit of claim 3, wherein the mounting surface portion includes a reflector layer formed as a portion of the first circuit pattern to reflect light emitted from the light emitting element.

7. The light source unit of claim 1, wherein the base unit includes a second circuit pattern formed on a rear surface thereof and electrically connected to the first circuit pattern.

8. The light source unit of claim 7, wherein the base unit includes a heat sink layer formed on the rear surface thereof as a portion of the second circuit pattern.

9. The light source unit of claim 7, wherein the base unit includes an electronic element electrically connected to the second circuit pattern and mounted on the rear surface of the base unit.

10. The light source unit of claim 8, wherein the base unit includes an electronic element electrically connected to the second circuit pattern and mounted on the rear surface of the base unit.

11. The light source unit of claim 3, wherein the mounting surface portion further includes a heat sink land provided adjacent to the mounting land, and
   the irradiation hole serving as the reflow stop is formed in a lower region of the heat sink land to suppress the reflow material from flowing down when mounting the light emitting element.

12. The light source unit of claim 1, the obtuse angle is set to be greater than 120 degrees.

13. The light source unit of claim 4, wherein the mounting surface portion of the base unit is formed as a concavely curved surface.

14. The light source unit of claim 5, wherein the mounting surface portion of the base unit is formed as a concavely curved surface.

15. The light source unit of claim 11, wherein the reflow stop of the heat sink land is configured by removing a conductive layer from the lower region of the heat sink land, and the reflow stop of the mounting land is configured by removing a conductive layer from the lower region of the mounting land.

16. The light source unit of claim 8, wherein a plurality of fine irregularities is formed on the rear surface of the base unit, and
   the heat sink layer is formed on a surface of the plurality of fine irregularities.

* * * * *